(12) United States Patent
Price et al.

(10) Patent No.: US 7,965,101 B2
(45) Date of Patent: Jun. 21, 2011

(54) COMBINED PROCESSING AND NON-VOLATILE MEMORY UNIT ARRAY

(75) Inventors: Neil Price, Bristol (GB); Anthony Ian Stansfield, Bristol (GB)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/713,672

(22) Filed: Feb. 26, 2010

(65) Prior Publication Data

US 2010/0213975 A1    Aug. 26, 2010

(30) Foreign Application Priority Data

Feb. 27, 2009 (EP) .................................... 09153966

(51) Int. Cl.
*H03K 19/173* (2006.01)
(52) U.S. Cl. ............................... 326/38; 326/41
(58) Field of Classification Search ............... 326/37–41
See application file for complete search history.

(56) References Cited

U.S. PATENT DOCUMENTS

| 7,242,218 | B2 * | 7/2007 | Camarota et al. ............... 326/41 |
| 7,378,871 | B2 | 5/2008 | Okamoto |
| 7,427,871 | B2 * | 9/2008 | Kelem et al. ....................... 326/9 |
| 7,474,559 | B1 * | 1/2009 | Lakkapragada et al. . 365/185.08 |
| 2007/0300201 | A1 | 12/2007 | Matsumoto et al. |

OTHER PUBLICATIONS

European Search Report issued in European Patent Application No. 09153966.8-1243, mailed Aug. 5, 2009.
Asari, K., et al., "FeRAM Circuit Technology for System on a Chip", Proceedings of the First NASA/DOD Workshop on Evolvable Hardware, Jul. 1999, pp. 193-197, Los Alamitos CA USA.

* cited by examiner

*Primary Examiner* — Don P Le
(74) *Attorney, Agent, or Firm* — McDermott Will & Emery LLP

(57) ABSTRACT

A reconfigurable logic device comprises an array of tiles interconnected through a routing network, each tile comprises both a processing unit including volatile configuration memory and a Random Access Memory unit.

7 Claims, 4 Drawing Sheets

COMBINED PROCESSING AND NON-VOLATILE MEMORY UNIT ARRAY

The present invention relates to a combined processing and non-volatile memory unit for use in a reconfigurable logic device.

Known reconfigurable devices typically comprise arrays of processing elements which are arranged in repeating units (often referred to as "tiles") and memory unit blocks (e.g. Static Random Access Memories SRAMs) which are embedded in the arrays, the processing elements and the memory blocks being connected through a routing network.

A problem with these known devices is that, because an embedded memory block can often be located relatively far away from a given processing unit, for a connection to be made from the processing unit to the small section of the memory block which is to be used by the processing unit, a significant routing overhead may be required. An increase in the routing demands of a circuit will adversely affect the timing of that circuit, thereby diminishing its overall performance.

In order to alleviate this problem, devices have been developed which use volatile memory units, such as Dynamic Random Access Memories (DRAMs), which are denser and can therefore be spread more evenly throughout an array.

The first problem which arises with devices which use volatile memory units is that, when the device is switched off, the memory units lose their programming. Accordingly, because of their need to be refreshed, these devices must be supplemented with further non-volatile memory which assists in configuring the volatile memory at power-up. As will be appreciated, these added memory units increase the overall size and complexity of the reconfigurable device.

The second problem which arises with devices which use volatile memory units is that typical volatile memory devices are very sensitive to noise. Thus, although the use of volatile memory units may decrease the routing overhead of a device, they will also increase the possibility of read and/or write errors which will act to decrease the overall performance of the machine.

In light of the above, it is clear that a need exists for a reconfigurable logic device which provides a decrease in routing overhead in a way which does not adversely affect the placing, routing and timing of a circuit which is to be placed thereon.

In order to solve the problems associated with the prior art, the present invention provides a reconfigurable logic device comprising an array of tiles interconnected through a routing network, each tile comprises: a processing unit including volatile configuration memory; and a Random Access Memory unit.

The routing network and the Random Access Memory unit may be situated in a routing layer.

The processing unit may be connected to the routing network.

The Random Access Memory unit may be connected to the routing network.

The processing unit and the Random Access Memory unit may be connected to a switching means, the switching means being operable to connect either the processing unit or the Random Access Memory unit to the routing network.

The Random Access Memory unit may be one of a Magnetoresistive Random Access Memory (MRAM) unit and a Ferroelectric Random Access Memory (FeRAM) unit.

As will be appreciated, the present invention provides several advantages over the prior art. For example, the combined RAM and processing units of the present invention create more evenly distributed RAM resources across the reconfigurable array. Moreover, when an application is placed on a device in accordance with the present invention, it can use a local RAM resource that is convenient for the rest of the application, rather than having to route signals over long distances and increasing routing congestion. The arrangement in accordance with the present invention will also put fewer constraints on the placement of the application, as many of the processing units will no longer be required to connect to specific blocks with set positions in the array. Accordingly, the present invention will make placing and routing applications onto an array easier, thereby facilitating area and timing optimisation of the resulting circuit.

An example of the present invention will now be described with reference to the accompanying drawings, in which.

Figure 1:
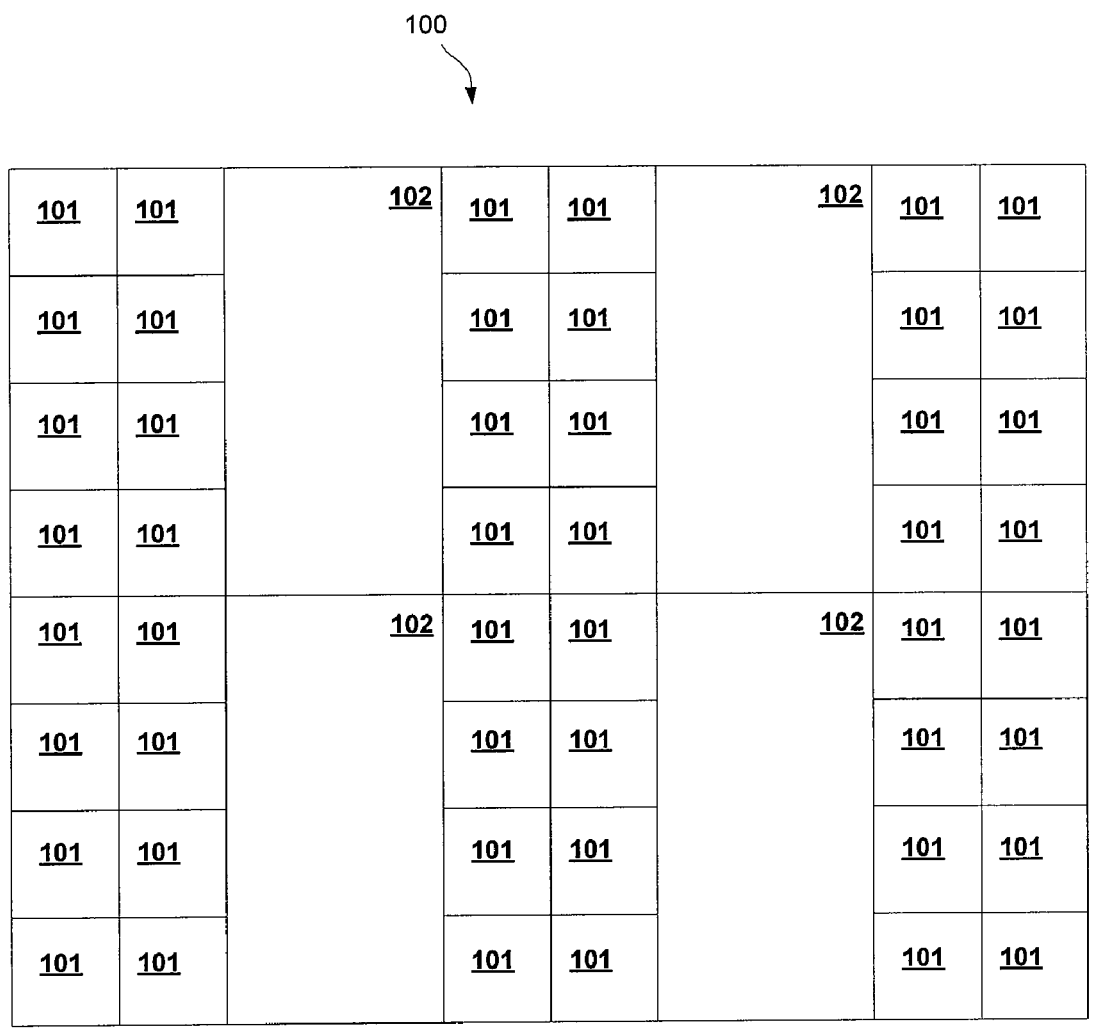
FIG. 1 represents a processing unit array with embedded block Random Access Memory (RAM) in accordance with the prior art.

As shown in FIG. 1, a standard reconfigurable device 100 comprises separate processing elements 101 (e.g. gates, look-up-tables, arithmetic logic units, etc) which are arranged in repeating units and dense Random Access Memory (RAM) blocks 102, these elements being interconnected through a single routing network (not shown). The RAM blocks 102 are typically arranged in a number of columns which are embedded in a larger array of processing elements 101.

The architecture shown in FIG. 1 is subject to two competing issues. On one hand, it is useful for applications to have RAM blocks spread throughout the array, such that they can be included in the application's placement wherever required. On the other hand however typical RAM blocks 102 are relatively large when compared to processing elements 101. For example, a look-up-table (LUT) may contain 16 bits to define its logic function, whereas a RAM block may contain 2 kbits (for 256×8 RAM) or more. Accordingly, although the density of the RAM layout may be reduced, typical RAM blocks 102 are still considerably larger than LUTs.

Typically, a compromise between these two requirements has been to replace a relatively small amount (e.g. 10%) of the array area with RAM blocks 102 and use the remaining array area for processing elements 101 and routing.

Traditionally, the denser alternative to SRAM has been Dynamic Random Access Memory (DRAM). However, DRAMs are not suitable for embedding in a programmable logic array because of their susceptibility to noise and their need for refreshing. Newer technologies however offer devices which are non-volatile and are of a size which is comparable to a DRAM cell. For example, technologies such as Magnetoresistive Random Access Memory (MRAM) and Ferroelectric Random Access Memory (FeRAM) are comparatively small and non-volatile. Accordingly, they do not need to be refreshed and they have reduced noise susceptibility.

Figure 2:
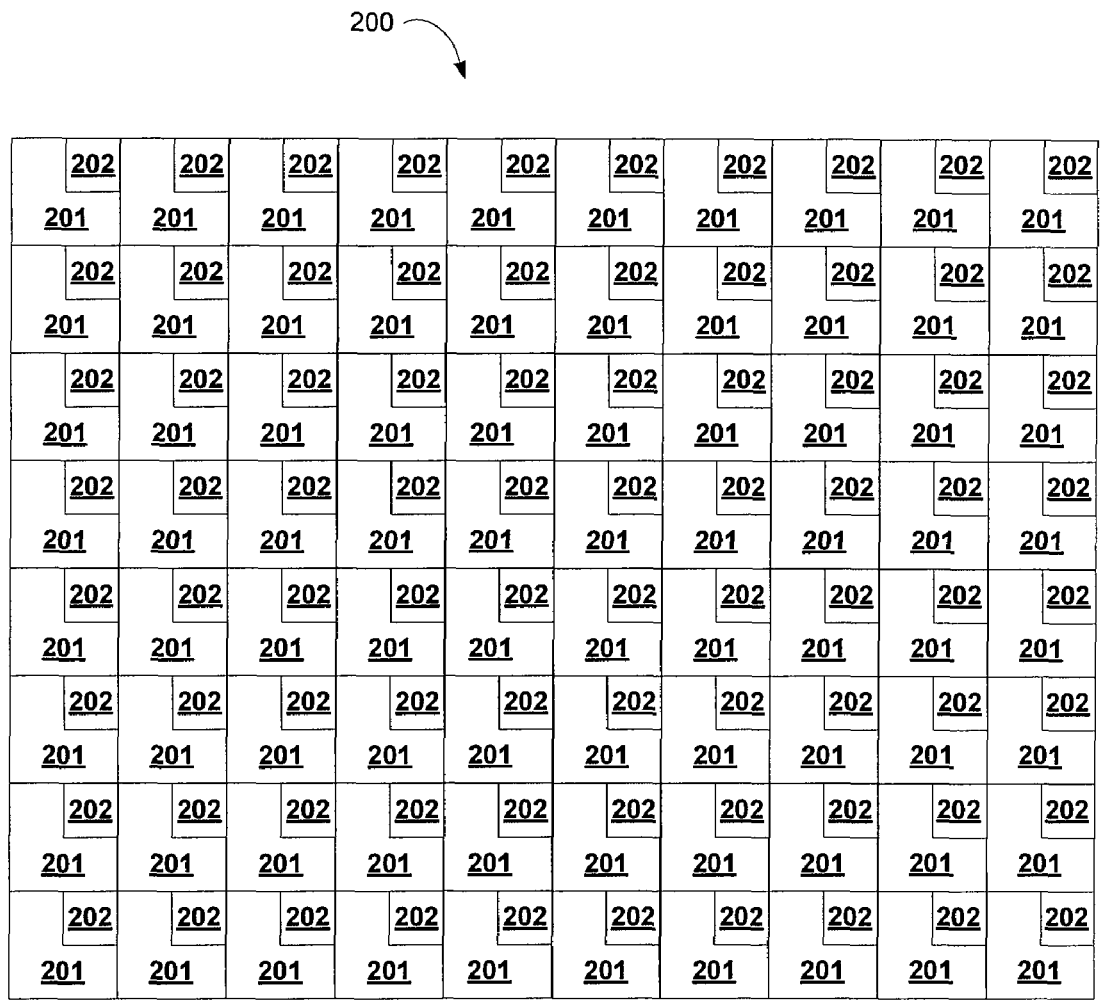
FIG. 2 represents an array of processing units that have integrated Random Access Memory (RAM) in accordance with the present invention.

Now, with reference to FIG. 2, an embodiment of the present invention will now be described. FIG. 2 shows an array 200 of similar size to that of FIG. 1. The array of FIG. 2 however does not comprise individual block RAMs but instead incorporates smaller RAMs 202 within the reconfigurable logic array itself.

Figure 3:
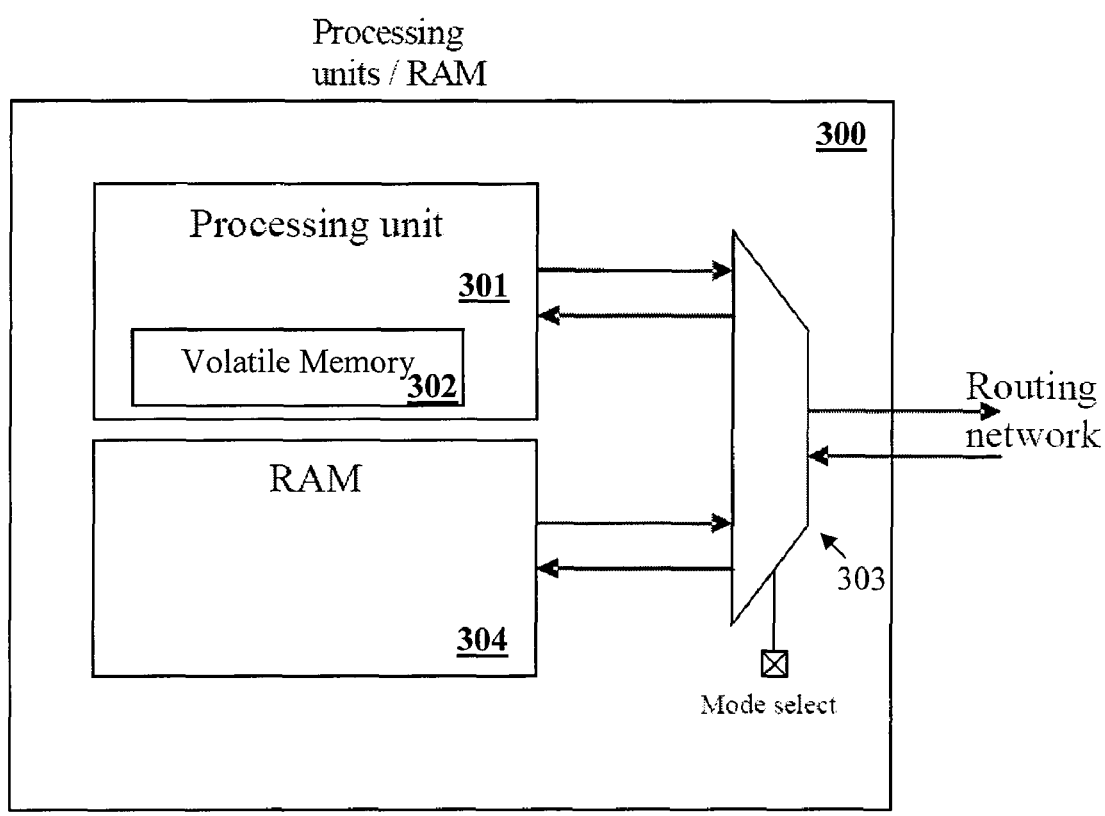
FIG. 3 represents a functional diagram of a combined processing unit and RAM in accordance with a first embodiment of the present invention.

FIG. 3 shows another embodiment of the present invention. In particular, FIG. 3 shows a combined processing element 300 comprising a processing unit 301, a non-volatile memory unit such as a RAM 304 and a switching means, such as a multiplexer 303. The processing unit comprises a volatile configuration memory unit 302.

As shown in the functional diagram of FIG. 3, the RAM 304 uses the same routing network connections as the processing unit 301. This allows the combined processing element 300 to act as either a processing unit 301 or a RAM 304. The function of the combined processing element 300 can be defined when the application is mapped to the array. Alternatively, it is possible for the combined processing element 300 to work in a dynamic mode where the mode select of the multiplexer 303 is controlled dynamically during run time.

Figure 4:
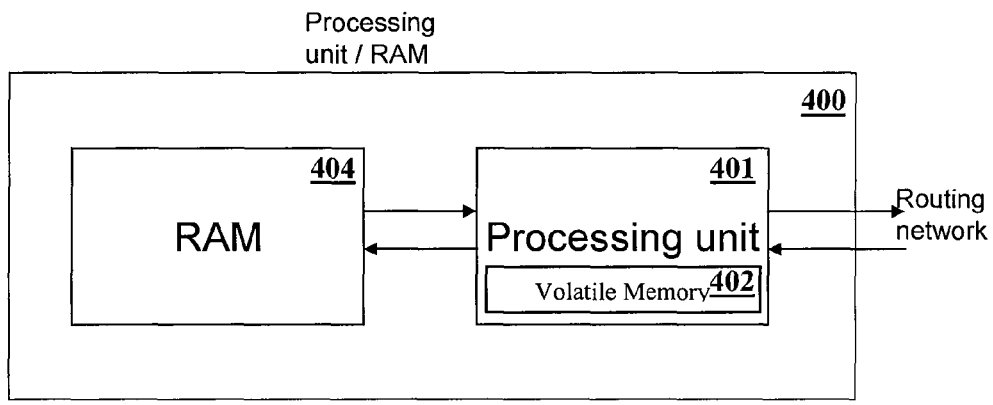
FIG. 4 represents a functional diagram of a combined processing unit and RAM in accordance with a second embodiment of the present invention.
Figure 5:
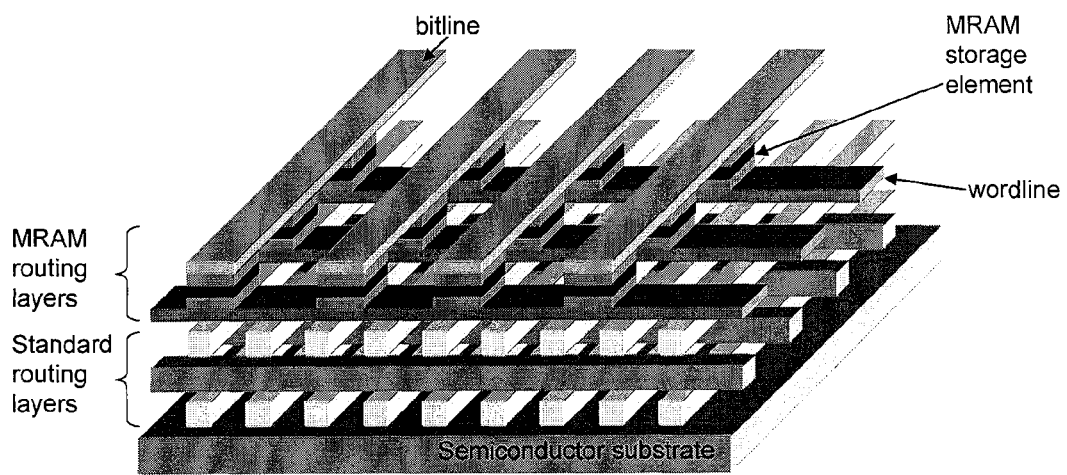
FIG. 5 represents a diagram of how the RAM of the present invention can be located in the routing layer.

Now, with reference to FIG. 4, a second embodiment of the present invention will now be described. The second embodiment of the present invention comprises a combined processing element 400 which includes processing unit 401 and a non-volatile memory unit such as a RAM 404.

Dissimilarly to the first embodiment however, the RAM 404 of the second embodiment is not connected to the routing network. Rather, the RAM 404 of the second embodiment is only connected to the processing unit 401. Accordingly, data being sent to and from the RAM 404 can be altered by the processing unit 401. As with the first embodiment of the present invention, the processing unit 401 of the second embodiment comprises volatile configuration memory 402.

A particular advantage to relating to the second embodiment of the present invention is that it is possible to use both the RAM 404 and the processing unit 401 at the same time. This allows for the removal of the routing resources which would normally be used to connect the RAM to a processing unit.

In each of the embodiments described above, the RAM of the present invention may be situated in the routing layer, as shown in FIG. 6. Each tile comprises a processing unit which is connected to a RAM, the RAM being situated in the routing layer of the reconfigurable logic array. This arrangement allows a RAM to overlay the processing unit using the same effective die area.

The present invention simplifies the task of placing and routing applications onto a reconfigurable array by increasing the accessibility of RAM resources in the array without adding extra area overhead or increasing instability. As will be appreciated, the invention can be applied to any configurable or reconfigurable device that is made up of multiple smaller processing units. Such devices include, for example, Field Programmable Gate Arrays (FPGAs) and Programmable Logic Devices (PLDs).

The invention claimed is:

1. A reconfigurable logic device comprising an array of tiles interconnected through a routing network, each tile comprising:
  a processing unit including volatile configuration memory; and
  a Random Access Memory unit,
  wherein the processing unit and the Random Access Memory unit are connected to a switching means, the switching means being configured to connect either the processing unit or the Random Access Memory unit to the routing network.

2. The reconfigurable logic device of claim 1, wherein the routing network and the Random Access Memory unit are situated in a routing layer.

3. The reconfigurable device of any of the proceeding claims claim 1 or claim 2, wherein the Random Access Memory unit is one of a Magnetoresistive Random Access Memory (MRAM) unit and a Ferroelectric Random Access Memory (FeRAM) unit.

4. A reconfigurable logic device comprising an array of tiles interconnected through a routing network, each tile comprising:
  a processing unit including volatile configuration memory; and
  a Random Access Memory unit,
  wherein the processing unit and the Random Access Memory unit are connected to a switching unit, the switching unit being configured to connect either the processing unit or the Random Access Memory unit to the routing network.

5. A reconfigurable logic device comprising an array of tiles interconnected through a routing network, each tile comprising:
  a processing unit including volatile configuration memory; and
  a Random Access Memory unit,
  wherein the processing unit and the Random Access Memory unit are connected to a multiplexer configured to connect either the processing unit or the Random Access Memory unit to the routing network.

6. A reconfigurable logic device comprising an array of tiles interconnected through a routing network, each tile comprising:
  a processing unit including volatile configuration memory; and
  a Random Access Memory unit,
  wherein the processing unit and the Random Access Memory unit are connected to a multiplexer which connects either the processing unit or the Random Access Memory unit to the routing network.

7. A reconfigurable logic device comprising an array of tiles interconnected through a routing network, each tile comprising:
  a processing unit including volatile configuration memory; and
  a Random Access Memory unit,
  wherein the processing unit and the Random Access Memory unit are connected to a switching circuit which connects either the processing unit or the Random Access Memory unit to the routing network.

* * * * *